(12) United States Patent
Tuominen et al.

(10) Patent No.: US 8,225,499 B2
(45) Date of Patent: Jul. 24, 2012

(54) METHOD FOR MANUFACTURING A CIRCUIT BOARD STRUCTURE, AND A CIRCUIT BOARD STRUCTURE

(75) Inventors: Risto Tuominen, Helsinki (FI); Antti Iihola, Helsinki (FI); Petteri Palm, Helsinkin (FI)

(73) Assignee: Imbera Electronics Oy, Espoo (FI)

( * ) Notice: Subject to any disclaimer, the term of this patent is extended or adjusted under 35 U.S.C. 154(b) by 795 days.

(21) Appl. No.: 11/917,724

(22) PCT Filed: Jun. 16, 2006

(86) PCT No.: PCT/FI2006/000211
§ 371 (c)(1),
(2), (4) Date: Apr. 28, 2008

(87) PCT Pub. No.: WO2006/134220
PCT Pub. Date: Dec. 21, 2006

(65) Prior Publication Data
US 2009/0014872 A1   Jan. 15, 2009

(30) Foreign Application Priority Data

Jun. 16, 2005 (FI) ..................................... 20050643
Jun. 16, 2005 (FI) ..................................... 20050646

(51) Int. Cl.
*H01L 23/34* (2006.01)
*H01L 21/00* (2006.01)
*H05K 1/02* (2006.01)
*H05K 1/11* (2006.01)
*H05K 3/00* (2006.01)
*H05K 3/18* (2006.01)
*H05K 3/40* (2006.01)

(52) U.S. Cl. .............. 29/829; 29/832; 29/841; 438/124; 438/126; 438/127; 257/713; 257/737; 257/778; 257/E21.502; 257/E21.505; 257/E21.499; 361/761; 361/764

(58) Field of Classification Search .................. 29/825, 29/829, 832, 841; 438/106, 124, 126, 127; 257/E21.502, E21.505, E21.499, 713, 737, 257/778; 361/761, 764
See application file for complete search history.

(56) References Cited

U.S. PATENT DOCUMENTS 3,781,596 A   12/1973   Galli et al.
(Continued)

FOREIGN PATENT DOCUMENTS
EP   0774888   5/1997
(Continued)

OTHER PUBLICATIONS

Examination Report Under Section 18(3) Application No. GB0724097.1, issued by the Great Britian Patent Office, dated Sep. 27, 2010.

*Primary Examiner* — Evan Pert
(74) *Attorney, Agent, or Firm* — Faegre Baker Daniels LLP

(57) ABSTRACT

This publication discloses a method for manufacturing a circuit-board structure.1. The structure comprises a conductor pattern (3) and at least one component (6), which is surrounded by an insulating-material layer (10), attached to it by means of a contact bump (5). According to the invention, the contact bumps (5) are made on the surface of the conductor pattern (3), before the component (6) is attached to the conductor pattern (3) by means of the contact bump (5). After attaching, the component (6) is surrounded with an insulating-material layer (10).

22 Claims, 5 Drawing Sheets

U.S. PATENT DOCUMENTS

| | | | |
|---|---|---|---|
| 4,246,595 A | 1/1981 | Noyori et al. | |
| 4,729,061 A | 3/1988 | Brown | |
| 4,731,645 A | 3/1988 | Parmentier et al. | |
| 4,764,804 A | 8/1988 | Sahara et al. | |
| 4,993,148 A | 2/1991 | Adachi et al. | |
| 5,042,145 A | 8/1991 | Boucquet | |
| 5,048,179 A | 9/1991 | Shindo et al. | |
| 5,081,562 A | 1/1992 | Adachi et al. | |
| 5,106,308 A * | 4/1992 | Gollomp et al. | 439/67 |
| 5,118,029 A * | 6/1992 | Fuse et al. | 228/198 |
| 5,118,386 A * | 6/1992 | Kataoka et al. | 216/13 |
| 5,216,806 A | 6/1993 | Lam | |
| 5,227,338 A | 7/1993 | Kryzaniwsky | |
| 5,248,852 A | 9/1993 | Kumagai | |
| 5,306,670 A | 4/1994 | Mowatt et al. | |
| 5,353,195 A | 10/1994 | Fillion et al. | |
| 5,355,102 A | 10/1994 | Kornrumpf et al. | |
| 5,407,864 A | 4/1995 | Kim | |
| 5,492,235 A * | 2/1996 | Crafts et al. | 438/695 |
| 5,497,033 A | 3/1996 | Fillion et al. | |
| 5,510,580 A | 4/1996 | Shirai et al. | |
| 5,552,633 A | 9/1996 | Sharma | |
| 5,633,204 A | 5/1997 | Tago et al. | |
| 5,637,919 A | 6/1997 | Grabbe | |
| 5,654,220 A | 8/1997 | Leedy | |
| 5,838,545 A | 11/1998 | Clocher et al. | |
| 5,840,593 A | 11/1998 | Leedy | |
| 5,861,341 A * | 1/1999 | Wen et al. | 438/628 |
| 5,870,289 A | 2/1999 | Tokuda et al. | |
| 5,877,560 A * | 3/1999 | Wen et al. | 257/778 |
| 5,882,957 A | 3/1999 | Lin | |
| 5,936,847 A | 8/1999 | Kazle | |
| 5,942,795 A * | 8/1999 | Hoang | 257/692 |
| 5,985,693 A | 11/1999 | Leedy | |
| 5,991,162 A | 11/1999 | Saso | |
| 6,037,665 A | 3/2000 | Miyazaki | |
| 6,038,133 A | 3/2000 | Nakatani et al. | |
| 6,084,781 A | 7/2000 | Klein | |
| 6,154,366 A | 11/2000 | Ma et al. | |
| 6,232,666 B1 | 5/2001 | Corisis et al. | |
| 6,242,282 B1 | 6/2001 | Fillion et al. | |
| 6,271,469 B1 | 8/2001 | Ma et al. | |
| 6,284,564 B1 | 9/2001 | Balch et al. | |
| 6,292,366 B1 | 9/2001 | Platt | |
| 6,353,189 B1 | 3/2002 | Shimada et al. | |
| 6,396,148 B1 | 5/2002 | Eichelberger et al. | |
| 6,402,970 B1 | 6/2002 | Lin | |
| 6,475,877 B1 | 11/2002 | Saia et al. | |
| 6,489,685 B2 | 12/2002 | Asahi et al. | |
| 6,537,848 B2 | 3/2003 | Camenforte et al. | |
| 6,538,210 B2 | 3/2003 | Sugaya | |
| 6,551,861 B1 | 4/2003 | Lin | |
| 6,576,493 B1 | 6/2003 | Lin | |
| 6,607,943 B1 | 8/2003 | Kinsman | |
| 6,701,614 B2 | 3/2004 | Ding et al. | |
| 6,710,458 B2 | 3/2004 | Seko | |
| 6,713,859 B1 | 3/2004 | Ma | |
| 6,783,077 B1 | 8/2004 | Fannasch | |
| 6,790,712 B2 | 9/2004 | Bai | |
| 6,806,428 B1 | 10/2004 | Kimura et al. | |
| 6,815,833 B2 * | 11/2004 | Lee et al. | 257/778 |
| 6,876,072 B1 | 4/2005 | Wang et al. | |
| 6,979,596 B2 | 12/2005 | Corisis et al. | |
| 6,991,966 B2 | 1/2006 | Tuominen | |
| 7,135,770 B2 * | 11/2006 | Nishiyama et al. | 257/734 |
| 7,170,170 B2 * | 1/2007 | Yeo | 257/737 |
| 7,183,658 B2 | 2/2007 | Towle et al. | |
| 7,294,529 B2 | 11/2007 | Tuominen | |
| 7,349,225 B1 | 3/2008 | Bennett | |
| 7,566,969 B2 * | 7/2009 | Shimanuki | 257/737 |
| 7,663,215 B2 | 2/2010 | Tuominen et al. | |
| 7,673,387 B2 | 3/2010 | Tuominen et al. | |
| 7,696,005 B2 | 4/2010 | Iihola et al. | |
| 7,795,710 B2 * | 9/2010 | Islam et al. | 257/666 |
| 7,799,607 B2 * | 9/2010 | Karashima et al. | 438/108 |
| 7,820,480 B2 * | 10/2010 | Islam et al. | 438/107 |
| 8,022,532 B2 * | 9/2011 | Kasuya et al. | 257/707 |
| 2001/0030059 A1 | 10/2001 | Sugaya et al. | |
| 2002/0000657 A1 * | 1/2002 | Wen et al. | 257/737 |
| 2002/0017711 A1 | 2/2002 | Kwon et al. | |
| 2002/0053465 A1 | 5/2002 | Kawakita et al. | |
| 2002/0117743 A1 | 8/2002 | Nakatani et al. | |
| 2002/0163075 A1 | 11/2002 | Ho et al. | |
| 2002/0166688 A1 | 11/2002 | Smith | |
| 2002/0185303 A1 | 12/2002 | Takeuchi et al. | |
| 2003/0058630 A1 * | 3/2003 | Takano et al. | 361/783 |
| 2003/0067074 A1 | 4/2003 | Kinsman | |
| 2003/0068852 A1 | 4/2003 | Towle et al. | |
| 2003/0068877 A1 | 4/2003 | Kinsman | |
| 2003/0100142 A1 | 5/2003 | Shin et al. | |
| 2003/0116866 A1 * | 6/2003 | Cher 'Khng et al. | 257/780 |
| 2003/0128522 A1 | 7/2003 | Takeda et al. | |
| 2003/0137045 A1 | 7/2003 | Sugaya et al. | |
| 2003/0141105 A1 | 7/2003 | Sugaya et al. | |
| 2003/0159852 A1 | 8/2003 | Nakamura | |
| 2003/0169575 A1 | 9/2003 | Ikuta et al. | |
| 2003/0209796 A1 | 11/2003 | Kondo et al. | |
| 2004/0000710 A1 | 1/2004 | Oya | |
| 2004/0203552 A1 | 10/2004 | Horiuchi et al. | |
| 2004/0212051 A1 | 10/2004 | Zhao et al. | |
| 2004/0212969 A1 | 10/2004 | Imamura et al. | |
| 2004/0266067 A1 | 12/2004 | Bai | |
| 2005/0000729 A1 | 1/2005 | Iijima et al. | |
| 2005/0001331 A1 | 1/2005 | Kojima et al. | |
| 2005/0110163 A1 | 5/2005 | Koo et al. | |
| 2005/0112798 A1 | 5/2005 | Bjorbell | |
| 2005/0285244 A1 | 12/2005 | Chen | |
| 2006/0011383 A1 | 1/2006 | Noguchi | |
| 2006/0105500 A1 | 5/2006 | Chang | |
| 2006/0163740 A1 | 7/2006 | Ohno et al. | |
| 2006/0278967 A1 | 12/2006 | Tuominen et al. | |
| 2007/0166886 A1 | 7/2007 | Iihola et al. | |
| 2007/0227761 A1 * | 10/2007 | Tuominen et al. | 174/252 |
| 2007/0267136 A1 | 11/2007 | Tuominen et al. | |
| 2008/0196930 A1 * | 8/2008 | Tuominen et al. | 174/260 |
| 2008/0202801 A1 | 8/2008 | Tuominen et al. | |
| 2008/0295326 A1 | 12/2008 | Tuominen et al. | |
| 2009/0014872 A1 * | 1/2009 | Tuominen et al. | 257/737 |
| 2009/0115050 A1 * | 5/2009 | Kasuya et al. | 257/701 |
| 2010/0202115 A1 | 8/2010 | Tuominen et al. | |

FOREIGN PATENT DOCUMENTS

| | | |
|---|---|---|
| EP | 1111674 A2 | 12/2000 |
| EP | 1111662 | 6/2001 |
| EP | 1139705 A1 | 10/2001 |
| EP | 1156525 | 11/2001 |
| EP | 1225629 A2 | 1/2002 |
| EP | 1304909 A1 | 10/2002 |
| GB | 1259602 | 1/1972 |
| GB | 1259602 A1 | 1/1972 |
| GB | 2342995 | 5/2000 |
| JP | 04283987 | 10/1992 |
| JP | 913567 | 5/1997 |
| JP | 2757748 | 5/1998 |
| JP | 200058741 | 8/1998 |
| JP | 2000151306 | 11/1998 |
| JP | 11103165 | 4/1999 |
| JP | 200208910 A1 | 7/2000 |
| JP | 2000208910 | 7/2000 |
| JP | 2000311229 | 11/2000 |
| JP | 2000349437 | 12/2000 |
| JP | 2001053447 | 2/2001 |
| JP | 2001274034 | 10/2001 |
| JP | 2001345560 | 12/2001 |
| JP | 2002016327 | 1/2002 |
| JP | 2002158307 | 5/2002 |
| JP | 2002270640 | 9/2002 |
| JP | 2002270640 A1 | 9/2002 |
| JP | 2002271033 | 9/2002 |
| JP | 2002368043 | 12/2002 |
| JP | 2002368043 A1 | 12/2002 |
| JP | 200337205 | 2/2003 |
| JP | 2003188314 | 7/2003 |
| JP | 2004072027 | 3/2004 |
| JP | 2004072027 A1 | 3/2004 |
| JP | 2004146634 | 5/2004 |
| WO | WO85/05496 | 12/1985 |

| WO | WO03/065778 A1 | 8/2003 |
| WO | WO03/065779 A1 | 8/2003 |
| WO | WO04/001848 A1 | 12/2003 |
| WO | WO2004/077903 A1 | 9/2004 |
| WO | WO2004077902 | 9/2004 |
| WO | WO2004089048 | 10/2004 |
| WO | WO2005020651 | 3/2005 |
| WO | WO2005027602 | 3/2005 |

* cited by examiner

METHOD FOR MANUFACTURING A CIRCUIT BOARD STRUCTURE, AND A CIRCUIT BOARD STRUCTURE

CROSS REFERENCE TO RELATED APPLICATION

This application is a U.S. nationalized patent application of PCT/FI2006/000211, filed Jun. 15, 2006, which claims priority to Finnish Patent Application No. 20050643 filed Jun. 16, 2005 and Finnish Patent Application No. 20050646 filed Jun. 16, 2005, the entire disclosures of each are hereby expressly incorporated by reference herein.

The present invention relates to both a method for manufacturing a circuit-board structure and to a circuit-board structure.

The manufactured circuit-board structure can form part of, for example, a circuit board, a multi-layer circuit board, a component package, or an electronic module.

The circuit-board structure comprises at least one layer of conductor patterns and at least one component, which is connected electrically to the conductor patterns. The electrical connection between the conductor patterns and the contact areas of the component are formed through conductive-material formations termed contact bumps.

The invention relates particularly to such circuit-board manufacturing methods, in which at least one component connected to a conductor pattern is surrounded with an insulating-material layer. Solutions of this kind can also be referred to alternatively as circuit-board or module structures, which contain buried, embedded, or built-in components. The insulating-material layer surrounding the component is typically part of the base structure of the circuit board or module, which forms a support for the innermost conductor layers of the circuit board or module.

Application publication US 2005/0001331 discloses a circuit-board structure manufacturing method, in which first of all a circuit board is manufactured, which comprises an insulator layer and a conductor pattern on the surface of it. After this, a semiconductor component is attached to the conductor patterns on the surface of the circuit board by means of a suitable flip-chip attachment method. The attachment takes place by means of contact bumps on the surface of the semiconductor component. In the method of the US publication, after the attachment of the component a patterned and unpatterned insulating-material layer is laminated on top of the circuit board, and on top of them a further conductor-pattern layer.

Patent publications U.S. Pat. Nos. 6,038,133 and 6,489,685, as well as application publication US 2002/0117743 disclose a method, in which a conductor pattern is made on the surface of detachable film and a semiconductor component is attached to the conductor pattern using a flip-chip attachment method. After this, the component is surrounded with an insulating-material layer and the detachable film is removed.

The aforementioned publications U.S. Pat. No. 6,038,133 and US 2002/0117743 also disclose a method, in which a component is attached by the flip-chip method to a unified conductor foil, instead of to conductor patterns, from which conductor foil conductor patterns are formed at a layer stage in the process. Corresponding methods are also disclosed, for example, in the publications, U.S. Pat. No. 5,042,145; WO 2004/077902; WO 2004/077903; and WO 2005/020651.

In addition to the aforementioned types of method, many other methods are also known, by means of which circuit-board structures containing components can be manufactured. For example, the components can first of all be placed inside an insulating-material layer and connected electrically to the conductor layer only after this, as disclosed in the application publication WO 2004/089048.

Attaching the component to a conductor pattern instead of to a unified conductor foil achieves the advantage that the conductor pattern can be first of all examined by an optical method prior to the attachment of components to the circuit-board blank. If the circuit boards or module being manufactured contain expensive components, cost advantages can be obtained using this conductor-pattern beforehand examination, because a faulty conductor pattern can be made good or removed from the process in an earlier stage. In the opposite procedure, components attached to the conductor foil and already embedded in the circuit-board blank will be lost if the patterning of the conductor foil fails.

The invention is intended to create a new method for the manufacture of a circuit-board structure.

The invention is based on attaching at least one component to the conductor pattern by means of contact bumps made on the surface of the conductor pattern.

Because the contact bumps are made on the surface of the conductor pattern, components without bumps, i.e. components on the surface of the contact areas of which separate contact bumps have not been made, can also be used in embodiments of the invention. Thus, according to a preferred embodiment, a component will be ready to be attached to the circuit-board structure directly after the manufacturing process of the semiconductors, which will make possible logistical and cost benefits in the manufacture of complete modules.

In most embodiments, the conductor patterns are made on the surface of a support layer, which support layer is removed in a later stage of the process.

In a first embodiment, a unified conductor-material film is formed on the surface of the support layer, and is patterned by a photo-lithographic and etching method, in which excess conductor material is removed, leaving the desired conductor pattern. In this case, the surface of the support layer and the etching agent to be used are selected, in such a way that the etching stops automatically at the surface of the support layer.

In a second embodiment, a conductor-pattern mask, which incorporates openings at the locations of the desired conductor patterns, is formed on the surface of the support layer, for example, by a photo-lithographic method. After this, the openings are filled with a conductive material, thus creating the desired conductor pattern.

In a third embodiment, the conductor-pattern mask, which incorporates openings at the locations of the desired conductor patterns, is formed on the surface of the support layer, for example, by a photo-lithographic method. After this, conductor material is grown electrolytically in the openings, thus creating the desired conductor pattern. The electrical current required by the electrolytic growing is led to the conductor pattern being grown through the support layer, so that the support layer is selected in such a way that at least the surface of the support layer is electrically conductive. Using this method high-quality and high-precision conductor patterns can be made.

In a fourth embodiment, a unified conductor-material film, which is patterned using a laser-ablation method, in such a way that excess conductor material is removed, leaving the desired conductor pattern, is formed on the surface of the support layer. In this case, a mask is not required for the patterning.

The contact bumps to be formed on the surface of the conductor pattern can also be made, for example, using some method referred to above in connection with the manufacture of the conductor patterns.

In one embodiment, the procedure is to first of all manufacture a conductor pattern according to the third embodiment described above, and after that and preferably before the removal of the conductor-pattern mask, to form a contact-bump mask, which contains openings at the locations of the desired contact bumps, on the surface of the conductor layer (and of the conductor-pattern mask) using, for example, a photo, x-ray, or electron-beam lithography method. After this, conductor material is grown electrolytically in the openings, in which case the desired contact bumps will be created. The electrical current required by the electrolytic growing is led to the contact bumps being grown through the support layer and the conductor pattern. Using this method, the contact bumps can also be manufactured very precisely. The cross-sectional surface area of the bumps can also be made small, in which case it is also possible to attach to the circuit-board structure semiconductor components with contact areas that are extremely small and which are placed densely on the surface of the component.

After the attachment of the component, the component can be surrounded with an insulating-material layer. In one embodiment, this is done in such a way that one or more pre-hardened material sheets are placed on the surface of the conductor pattern and the component, and are pressed onto the structure with the aid of heat. Before the manufacture of the insulating-material layer, the space between the component and the conductor pattern can also be filled with a filler agent.

If a mask is used in an embodiment for the manufacture of a conductor pattern, and/or contact bumps, the mask or masks can be removed before the component is surrounded by the insulating-material layer and before the possible filling of the space between the component and the conductor pattern. In some embodiments, the mask or masks is/are removed by dissolving. If the masks are removed, this generally done before the component is attached. The removal of the mask is not, however, essential if the material of the mask has been selected in such a way that it meets the requirements set for the circuit-board product, such as an electronic module, being manufactured.

After the manufacture of the insulating-material layer, it is possible to make, on one or other, or both of the surfaces, additional conductor-pattern layers, which are separated from each other by an insulating layer and which are connected electrically to each other if necessary with the aid of vias. The number of conductor-pattern layers can be selected freely according to the embodiment. Thus, for example, there can be one, two, three, four, five, six, or more conductor-pattern layers.

In the following, the invention is examined with the aid of examples and with reference to the accompanying drawings.

Figure 1:
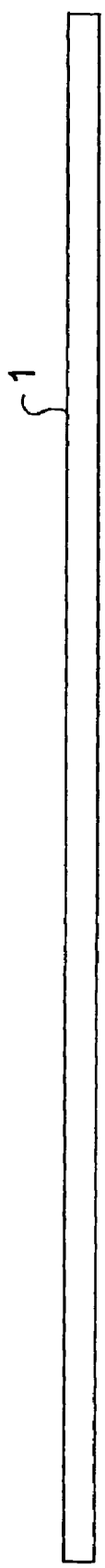
FIGS. 1-12 show a series of cross-sections on the intermediate stages of circuit-board structures in a manufacturing process according to some embodiments.

In the method used as an application example, manufacture is started according to FIG. 1 from a support layer 1, which is electrically conductive on a least one surface. The conductivity property is required, for example, at a later stage in the method according to this example, to conduct the current required for electrolytic growing to the area in which the conductor material is being grown. In a method, in which the electrolytic growing of a conductor material is replaced by some other manufacturing method, the conductivity property of the support layer 1 will not necessarily be required, in which case the support layer 1 can also be non-conductive. In the example of the figures, the support layer 1 is, however, made throughout of a conductive material, typically of a metal and most usually of copper. The task of the support layer 1 is to provide mechanical support for the circuit-board blank, so that the support layer 1 must have the mechanical durability and stiffness required for processing. In the case of a copper sheet, these properties are achieved by selecting the thickness of the support layer 1 to be, for example, more than 50 micrometers.

Figure 2:
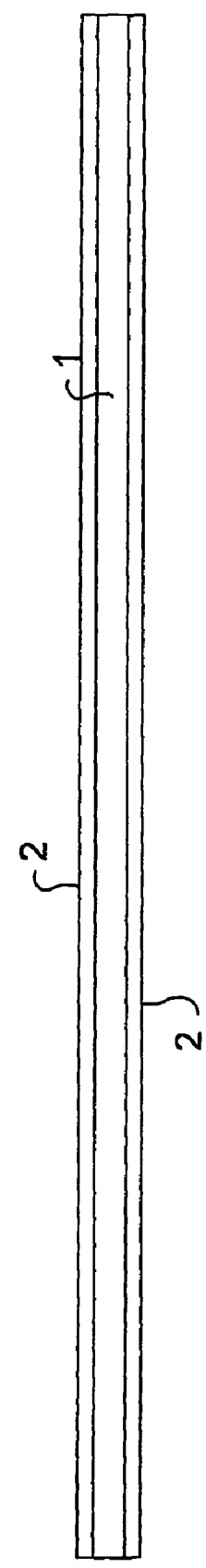
Figure 3:
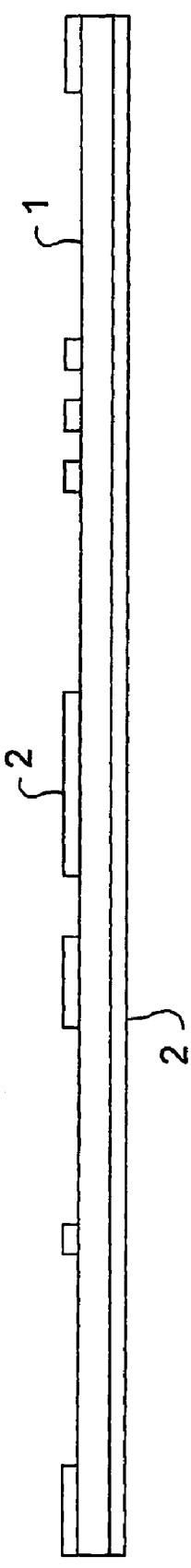

After this, resist layers 2, typically photo-resist layers, are spread on both surfaces of the support layer 1. This stage is shown in FIG. 2. The photo-resist layer 2 is exposed through a patterned mask from one surface of the support layer 1, after which the blank is developed. After developing, the exposed photo-resist layer 2 is patterned as desired to form a conductor-pattern mask, which is shown in FIG. 3.

Figure 4:
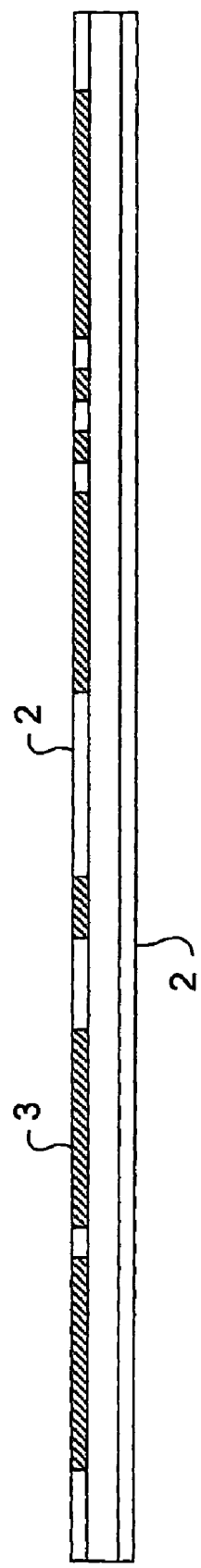

Manufacture is continued by electrolytically growing a conductor material, typically copper, in the areas from which the photo-resist has been removed. The desired conductor pattern 3, which is shown in FIG. 4, is thus formed on the surface of the support layer 1. The thickness of the conductor pattern can be, for example, 20 micrometers, while the thickness of the line of the conductor patterns made can also be less than 20 micrometers. Thus, the method can also be used to manufacture small and precise conductor patterns.

Figure 5:
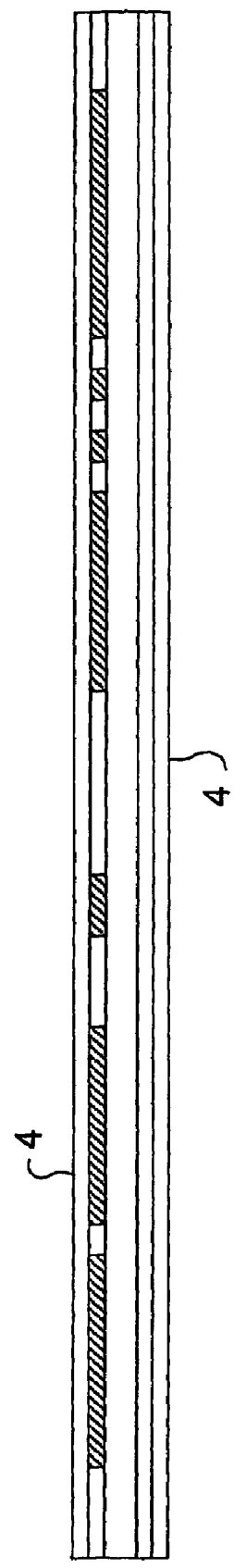
Figure 6:
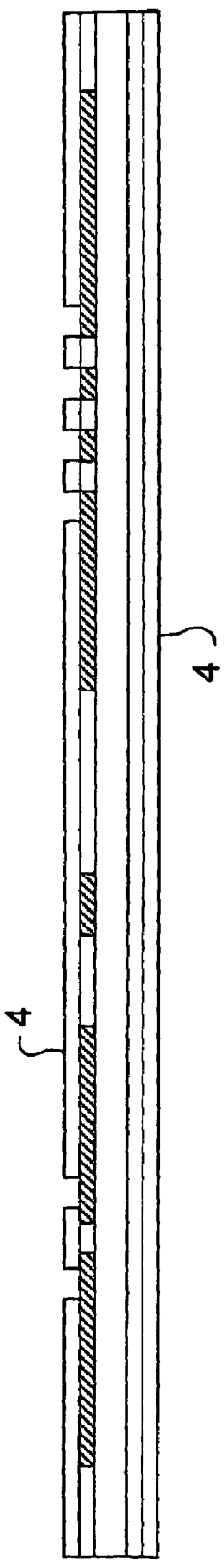

According to FIG. 5, a new photo-resist layer 4 is spread on both surfaces of the circuit-board blank, or at least on the surface on which the conductor pattern 3 is located. For the manufacture of the contact-bump mask, the photo-resist layer 4 is patterned and developed as described above. The result is then a blank according to FIG. 6, in which the conductor pattern 3 is revealed in places. Instead of a conventional photo-lithography technique, it is, of course, possible to use a resist to be patterned by a laser and laser patterning. It is also possible to use lithography method using a shorter wavelength, for example, x-ray lithography, when it is will be possible to achieve even smaller circuit-sizes. High-precision small structures can also be patterned, for example, using electron-beam lithography.

Figure 7:
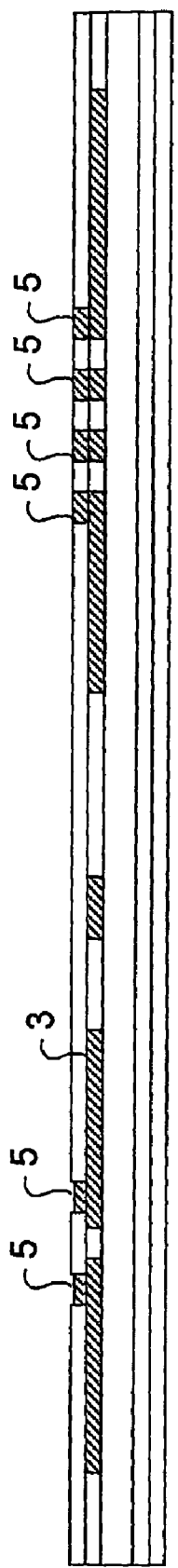
Figure 8:
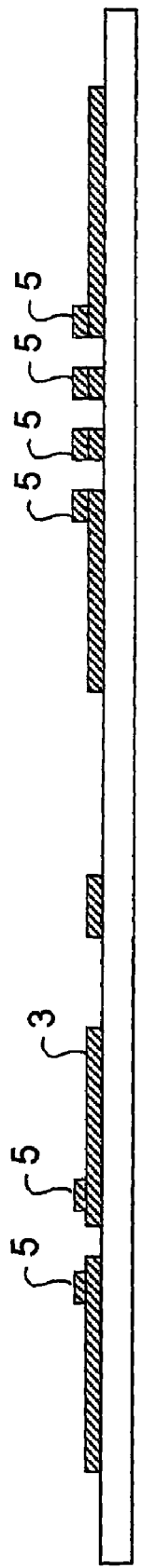

In the next stage, metal is once again grown electrolytically on the circuit-board blank. This achieves the intermediate stage shown in FIG. 7, in which there are contact bumps 5 formed by conductor material on top of the conductor patterns 3 at desired locations. In the method of the example, a thin layer of nickel and gold can be further grown on the surface of the copper contact bumps 5. After this, the resist layers 2 and 4 can be removed, leaving the circuit-board blank shown in FIG. 8. Components 6, for example, integrated circuits, can now be attached to this blank. The component 6 being attached can be, for example, a memory chip, a processor, or an ASIC. The component being attached can also be, for example, a MEMS, LED, or a passive component. The component being attached can be cased or uncased and can comprise contact bumps in its contact areas or be without bumps. On the surface of the contact areas of the component there can also be a conductor surfacing that is thinner than the contact bumps. Thus, the outer surface of the contact areas of the component can be at the level of the outer surface of the component, on the bottom of recesses in the surface of the component, or on the surface of protrusions extending from the surface of the component.

In the method of the example, the components 6 are attached by ultrasonic bonding. Instead of ultrasonic bonding, it is, of course, possible to use some other suitable flip-chip attachment technique. In the method of the example, allowance must be made for the fact that, because contact bumps 5 have been made in the circuit-board blank, the components 6 being attached need not themselves comprise contact bumps. Thus in the method it is possible to utilize the components 6 directly after the semiconductor manufacturing process, without the formation of bumps having to be performed on the components, which is typically performed as a separate process. With the aid of this property, significant logistic advantages and cost benefits can be achieved.

Figure 9:
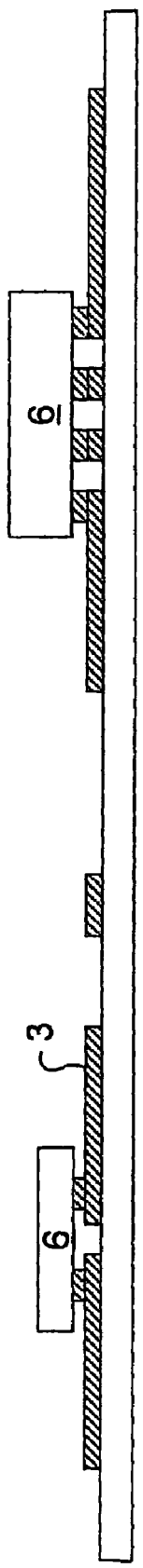

After the semiconductor manufacturing process, there are contact areas, which are typically of aluminium, on the surface of the component 6. In the method of the example, the contact bumps 5 are located in the circuit-board blank to correspond to these contact areas of the components 6 while the surface areas of the contact bumps 5 are typically designed to be slightly smaller than the contact areas of the components 6. This means that in a typical embodiment the width of a contact bump 5 will be in the range 10-30 micrometers. Of course, the typical range of variation can be deviated from according to the requirements set by the application. The height of the contact bump 5 is typically in the range 10-20 micrometers, but in this too it is possible to deviate from the typical variation range and make a contact bump 5 lower or higher than stated. FIG. 9 shows a circuit-board blank, in which two different components 6 are attached to the conductor patterns 3 by means of contact bumps.

Figure 10:
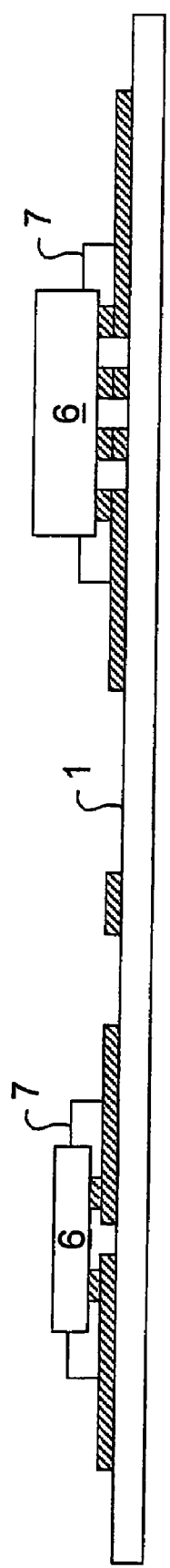

After the attachment of the component 6, the space between the component 6 and the support layer 1 can be filled with a filler agent 7. The result will then be the intermediate product shown in FIG. 10. Though the filler 7 is intended to reinforce the joint between the component 6 and the rest of the circuit-board blank, the use of a filler 7 is not, however, essential in all embodiments.

Figure 11:
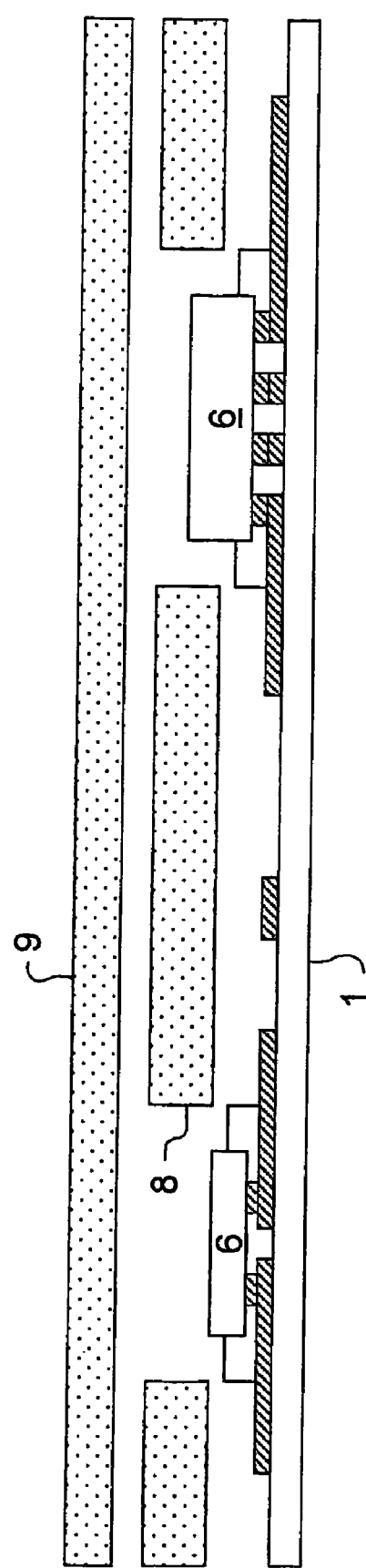

Next, an insulating layer 10 surrounding the component 6 is made. In the example of FIG. 11, an insulating layer 10 is formed by placing an insulating-material sheet 8, in which openings are made at the locations of the components 6, on top of the circuit-board blank. In addition, a continuous insulating-material sheet 9 is placed on top of the insulating-material sheet 8. Both sheets can be similar, or else sheets that differ from each other can also be used, at least one of which is pre-hardened or unhardened. Examples of materials suitable for the insulating layer 10 are PI (polyamide), FR1, FR5, aramid, polytetrafluorethylene, Teflon®, LCP (liquid crystal polymer), and a pre-hardened binder layer, i.e. prepreg.

Figure 12:
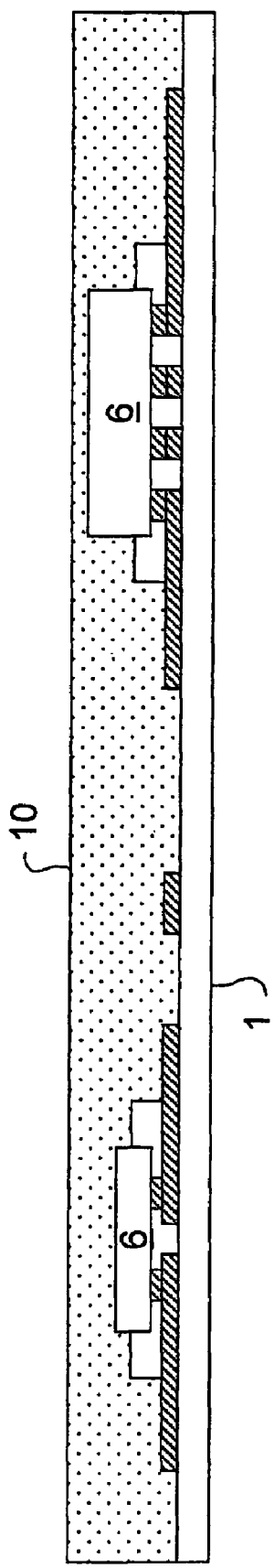

The insulating-material sheets 8 and 9 put on top of the circuit-board blank are pressed with the aid of heat and pressure to become a unified insulating layer 10. FIG. 12 shows a cross section of the circuit-board blank after this intermediate stage. In the insulating-material sheets, for example, on the upper surface of sheet 9, there can also be a ready conductor-pattern layer, in which case after pressing the circuit-board blank will comprise at least two conductor-pattern layers.

As can be seen from FIG. 11, components of differing thicknesses can also be attached to the circuit-board blank. If the difference in the thicknesses of the components is considerable, it is possible to proceed, for example, in such a way that openings are made in the lowest insulating-material layer 8 at the location of each component 6 while openings are made in the following insulating-material layer 8 or 9 only at the locations of the thickest components 6. If the difference in thickness is large, openings for the thickest components can also be made in the conductor layer on the surface of the laminating insulating layer, if such a conductor layer is used in the circuit-board structure. Thus the manufacture of the insulating layer 10 in layers from pressed insulating-material layers 8 and 9 will provide a significant degree of freedom in terms of the components 6 to be placed inside the insulating layer. This will also permit the use of thick components. In many cases, thicker components, which are also cheaper, are more readily available.

Figure 13:
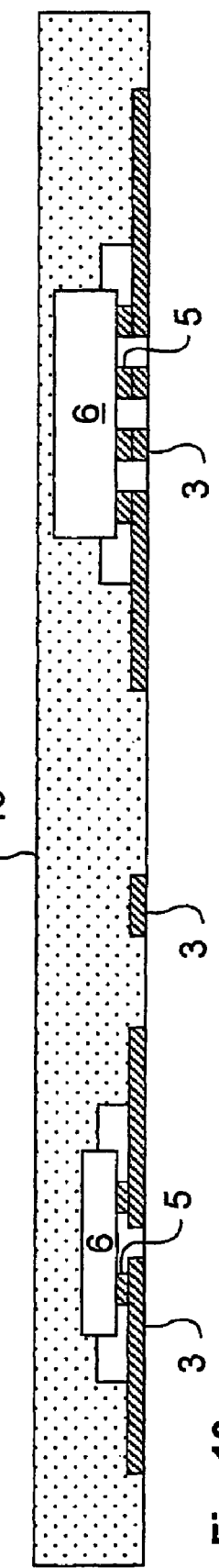
FIG. 13 shows a series of cross-section of one example of the circuit-board structure, after the intermediate stages shown in FIGS. 1-12.

After the manufacture of the insulating layer 10, the support layer 1 can be removed, resulting in the structure shown by FIG. 13. The support layer 1 can be removed, for example, by etching or mechanically.

In an embodiment, in which the support layer 1 and the conductor patterns 3 are of the same material, for example, copper, and the support layer 1 is removed by etching, the boundary surface of the conductor patterns 3 on the support-layer 1 side can be manufactured more precisely, if a suitable intermediate layer, which will not dissolve in the etching agent used, or dissolves in it only extremely slowly, is used between the conductor patterns 3 and the support layer 1. In that case, the etching will stop at the intermediate layer and the surface of the conductor patterns 3 can be defined precisely. Such an intermediate layer can be made, for example, from some second metal. The intermediate layer can be made, for example, on the entire surface of the support layer 1 before the manufacture of the conductor patterns 3 and removed after the removal of the support layer 1, for example, chemically using some second etching agent. It is also possible to made the intermediate layer in connection with the growing of the conductor patterns 3, in such a way that first of all the material of the intermediate layer is grown on top of the support layer 1 and the actual conductor patterns 3 are grown on top of the material of the intermediate layer. In such an embodiment, the intermediate layer is thus manufactured only at the locations of the conductor patterns, thus saving material of the intermediate layer.

In the depiction of the embodiment described above, the term ultrasonic bonding refers to a method, in which pieces containing two metals are pressed against each other and vibrational energy is introduced to the area of the joint at an ultrasonic frequency. Due to the ultrasound and the pressure created between the surfaces to be joined, the pieces are connected to each other. Methods and equipment for ultrasonic bonding are available commercially.

The terms metal layer, metal foil, metal contact bump, metal contact area, and generally a piece of metal refer, in turn, to the fact that the manufacturing material of the piece contains at least one metal in a sufficient quantity for the piece to form a metallurgical joint with another piece. The piece can naturally also contain several metals in layers, accumulations, zones, and metal alloys. Possible metals that can be referred to particularly are copper, aluminium, nickel, gold, and tin.

When using semiconductor components without bumps, the material of the contact areas of the component 6 will determine the semiconductor manufacturing process to be used. Nowadays, the most usual conductor material in semiconductor processes is aluminium, to that aluminium is especially referred to in the application examples. Our method is not, however, restricted to any particular contact-area manufacturing material, but instead the contact-area material can be any suitable material whatever. Examples of other conductor materials that can be given are copper and gold, which have also begun to be used in semiconductor processes.

Correspondingly the material of the conductor patterns 3 can be selected freely, within the scope of the requirements set by the application and what is permitted by the available manufacturing methods. In the application examples, particular mention is made of copper, because copper is the most common conductor-layer manufacturing material presently used in circuit-board manufacturing processes.

The material of the contact bumps 5 can be selected, in turn, in such a way that the joint between the conductor patterns 3 and the contact areas of the component 6 is possible by means of bumps 5. If the materials of the contact areas and the conductor patterns 3 differ from each other, the two different materials can be adapted to each other with the aid of a contact bump 5. For this purpose, the contact bump 5 can also be made as a layered structure containing two or more layers, the materials of which can differ from each other. Indeed, in the application examples a structure is referred to, in which the contact bump 5 contains first of all a copper layer on top of a copper conductor pattern 3, followed by a thin nickel layer on the surface of the copper layer, and then still on top of this a thin gold layer, through which a connection is created to an aluminium contact area.

In connection with the method, it is also possible to use components, on the contact areas of which a surfacing thinner than a normal bump is made prior to attachment. Thus several useful alternatives exist for the materials used on the outer surface of the contact areas or contact bumps of components and the manufacturing method of the circuit-board structure is adapted to correspond to the components used. The following lists some alternatives for the implementation of the joint between the component 6 and the conductor pattern 3, in connection with the method described, or with a variation of it.

If the conductor material inside the component and in its contact areas is copper, the contact bump 5 and the conductor patterns 3 can also be entirely of copper.

If the conductor material inside the component and in its contact areas is aluminium and the conductor patterns 3 are copper, the joint can be implemented with the aid of a bump with a suitable intermediate layer. The intermediate layer can be formed of, for example, gold, or nickel and gold.

A tin layer, which is attached with the aid of a suitable intermediate layer, for example, to a copper conductor pattern 3, can also be made in the contact area of the component 6. In one example, a solder layer is made in the contact area of the component 6, the joint being implemented with the aid of the solder.

One alternative is to make the bumps on top of the conductor layer 3 using the stud-bump technique.

Further, one alternative for the manufacture of the bumps is to use the ink-jet technique and spray a conductive material on top of the conductor layer 3.

The energy required to form a joint between the component and the conductor layer 3 can also be brought to the joint area by, in addition to, or instead of the ultrasonic method referred to above, for example, conducting it thermally. Thus, instead of the ultrasonic method, it is possible to use, for example, the thermo-compression method, or soldering.

A contact bump 5, part of a contact bump 5, or an intermediate layer between a contact bump 5 and a contact area of a component (or the contact bump of the component) can also be manufactured with the aid of an electrically conductive adhesive, in which case the ultrasonic, thermo-compression, or soldering method will not be required. The adhesive can be an isotropically or an-isotropically conductive adhesive.

In addition to the contact bumps 5, thermal bumps, or thermal vias, which are intended to conduct heat away from the component 6, can also be manufactured in the circuit-board structure. The more efficient conducting of heat is based on the fact that the thermal conductivity of the material of the thermal bump or thermal via is greater than that of the surrounding insulating material. Because electrical conductors are typically also good thermal conductors, the thermal bumps or thermal vias can usually be manufactured using the same technique, and even in the same process stage as the contact bumps 5.

There is often the difference between a contact bump 5 and a thermal bump that a thermal bump does not form an electrical contact with the component 6. For example, the thermal via or thermal bump may come into contact with the component 6 at such a point at which the surface of the component is protected by an insulating protector layer. A gap, which can be, for example, 1-15 micrometers, can also be left between the surface of the thermal contact and that of the component. This gap can possibly be filled with an insulating material when surrounding the component with an insulating material. If the component 6 itself comprises contact bumps, the thermal bumps will automatically remain at a distance from the component 6 defined by the height of the contact bumps, even in such embodiments, in which the thermal bumps and contact bumps 5 are made using the same material and to the same height. In such an embodiment, thermal conductivity can be further improved by making thermal bumps on the surface of the component, which are intended to conduct heat away from the component. In that case, the thermal bumps of the component and the thermal vias of the circuit-board structure can, in the finished structure, come into mechanical contact with each other.

Generally, the number, cross-sectional area, and locations of the thermal vias or thermal contacts are selected according to the thermal transmission requirement and by taking account of the fact that the thermal conductors will not cause unreasonable interference with the electrical operation of the component. However, it is preferable to locate the thermal vias at the position of the component, or immediately adjacent to it. Thus, the thermal via can be located on either principal surface of the component, or on a side surface, or in the vicinity of either of these. There is generally more free space for thermal vias on that principal surface of the component, on which there are no contact areas, or on which there are fewer contact areas. Indeed, it is preferable to manufacture thermal vias on precisely this surface of the component.

Thermal vias can be manufactured using the same techniques that are used to manufacture electrical contacts to the components. Thus a thermal via can be manufactured, for example, using a via method. In the via method, contact openings are made first. The contact openings are then filled with a conductive material, for example, a metal or metal alloy. The contact openings can be filled, for example, by growing metal in the openings, using a surfacing method, for example, a chemical and/or an electrochemical surfacing method. It is then possible to achieve a via structure in the contact openings, which is substantially of pure metal. Correspondingly, it is also possible to manufacture vias between the different conductor-pattern layers.

In some embodiments, the thermal vias or thermal bumps can also be used to form electrical contacts with the component. Particularly the ground contact of the component can be naturally applied to this purpose. In that case, the ground contact of the component is made to have a considerably greater cross-sectional area than normal, or the ground contact is made from several separate ground contacts, the combined cross-sectional area of which is considerably greater than that of a conventional ground contact.

It is also preferable to make in the circuit-board structure conductor patterns for conducting heat, corresponding to the conductor patterns 3. Thermal contacts are made on the surface of such thermal conductors, so that the thermal vias or thermal bumps (corresponding bumps 5) conduct thermal energy from the component to the thermal conductors (corresponding conductor patterns 3), which conduct thermal energy in the lateral direction of the circuit-board structure away from the vicinity of the component. In the case of thermal bumps, the contact can be made, for example, in such a way that the thermal bumps are made on the surface of the thermal conductors. In the case of thermal vias, contact can be made, for example, in such a way that the thermal via is made through the thermal conductors, or into contact with the edge area of the thermal conductors. These lateral thermal conductors can further be combined with vertical thermal conductors, with the aid of which the thermal effect can be conducted from the innermost layers to the outer surface of the electronic module or other circuit-board structure. The thermal conductors extending to the surface can, in turn, be connected to a suitable heat sink, in which case the cooling of the component will be made even more efficient.

The circuit-board structure or electronic module, shown by FIG. 13, contains a component 6 or several components 6, as well as conductor patterns 3, with the aid of which the component 6 or the components 6 can be connected to an external circuit or to each other. Indeed, FIG. 13 shows an example of one possible electronic module. If desired, the process can, of course, also continue after the stage shown by FIG. 13, for example, by surfacing the electronic module with a protective substance or by manufacturing additional conductor-pattern layers to the first, and/or the second surface of the electronic module.

On the basis of the example of FIG. 13, it is obvious that the method can also be used in the manufacture of many different kinds of three-dimensional circuit structures. The method can be used, for example, in such a way that several semiconductor chips are place on top of each other, thus creating a packet containing several semiconductor chips, in which the semiconductor chips are connected to each other to form a functional totality. Such a packet can be referred to as a three-dimensional-multichip module. In such a module, the semiconductor chips can be selected freely and the contacts between the different semiconductor chips can be easily made according to the selected semiconductor chips.

The examples of the figures depict some possible processes, with the aid of which our invention can be exploited. However, our invention is not restricted to only the processes described above, but instead the invention covers various other processes too and their end products, within the full scope of the Claims and taking equivalence interpretation into account. The invention is also not restricted to only the structures and methods described by the examples, but instead it will be obvious to one versed in the art that various applications of our invention can be used to manufacture very many different kinds of electronic modules and circuit boards, which may even differ greatly from the examples presented. Thus the components and circuits of the figures are presented only with the intention of illustrating the manufacturing process. Many alterations can be made to the processes of the examples described above, while nevertheless not deviating from the basic idea according to the invention. The alterations can relate, for example, to the manufacturing techniques depicted in the various stages, or to the mutual sequence of the process stages.

With the aid of the method, it is also possible to manufacture component packets for attachment to a circuit board. Such packets can also contain several components, which are connected electrically to each other.

The method can also be used to manufacture entire electrical modules. The module can also be a circuit board, to the outer surface of which components can be attached, in the same way as to a conventional circuit board.

The invention claimed is:

1. Method for manufacturing a circuit-board structure, which structure comprises a component inside an insulating-material layer, the method comprising:
    making a first conductor pattern;
    making a second conductor pattern corresponding to the first conductor pattern and intended for conducting thermal energy away from the vicinity of the component;
    making at least one contact bump on a surface of the first conductor pattern using a first manufacturing process;
    making at least one thermal bump on a surface of the second conductor pattern using the first manufacturing process;
    after making the at least one contact bump, attaching the component to the first conductor pattern by means of the at least one contact bump; and
    after attaching the component, making the insulating-material layer around the component.

2. Method according to claim 1, characterized in that the component comprises several contacts, for each of which an individual contact bump is made on the surface of the first conductor pattern.

3. Method according to claim 1, characterized in that the component is a semiconductor chip, on a surface of which are contact areas, which are connected to contact bumps corresponding to the contact areas.

4. Method according to claim 3, characterized in that the component to be connected to the contact bumps is an unpackaged and bumpless semiconductor chip.

5. Method according to claim 1, characterized in that a joint between the component and the contact bump is made using an ultrasonic bonding method.

6. Method according to claim 1, characterized in that the insulating-material layer is made by pressing together at least two insulating-material sheets, at least one of which comprises openings for the component.

7. Method according to claim 6, characterized in that the component is one of at least two components which are attached to the first conductor pattern, one of the at least two components being thicker than another of the at least two components which is thinner than the thicker component, and at least one of the insulating-material sheets to be pressed comprises at opening at the location of the thicker component, but has at least substantially no opening at the location of the thinner component.

8. Method according to claim 1, characterized in that the first conductor pattern is manufactured on a surface of a support layer, which support layer is removed after the insulating-material layer has been made around the component.

9. Method according to claim 8, characterized in that a mask layer, which contains openings defining the first conductor pattern, is formed on the surface of the support layer for the manufacture of the first conductor pattern, and the first conductor pattern is manufactured in these openings by electrolytic growing.

10. Method according to claim 8, characterized in that an intermediate layer is used between the first conductor pattern and the support layer, and the support layer is removed by etching as far as the intermediate layer, which acts as an etching stop.

11. Method according to claim 1, characterized in that a patterned mask layer, which contains openings for the contact bumps, and in which the contact bumps are made, is formed on the surface of the first conductor pattern for the manufacture of the contact bumps.

12. Method according to claim 11, characterized in that the contact bumps are made by electrolytic growing and the electrical current required for the electrolytic growing is led to the contact bump being grown, through the first conductor pattern and a support layer.

13. Method according to claim 1, characterized in that the contact bumps and the first conductor pattern are at least principally of copper.

14. Method according to claim 1, characterized in that on the surface of the contact bump intended to face the component there is a layer, which contains gold.

15. Method according to claim 1, characterized in that the contact bumps are connected to connector surfaces of the component, which are made from aluminium, copper, or gold.

16. Method according to claim 1, characterized in that several conductor-pattern layers are made in the circuit-board structure.

17. Method according to claim 1, characterized in that a thermal via is manufactured using a via technique.

18. Method according to claim 17, characterized in that the thermal via is manufactured to be in contact with the second conductor pattern corresponding to the first conductor pattern.

19. Method according to claim 1, characterized in that a vertical thermal conductor is manufactured to be in contact with a lateral thermal conductor which is in contact with a thermal via or a thermal bump, so that thermal effect can be conducted through the vertical and/or the lateral thermal conductor from innermost layers of the circuit-board structure towards its outer surface.

20. Method according to claim 19, characterized in that the vertical thermal conductor is connected to a heat sink, which is located outside the circuit-board structure or on the outer surface of the circuit-board structure.

21. Circuit-board structure comprising:
a first conductor pattern and at least one component;
a second conductor pattern corresponding to the first conductor pattern and intended for conducting thermal energy away from a vicinity of the at least one component;
at least one contact bump on a surface of the first conductor pattern, the at least one contact bump having a material and a height determined by a first manufacturing process;
at least one thermal bump on a surface of the second conductor pattern, the at least one thermal bump made of the material and having the height determined by the first manufacturing process; and
an insulating-material layer disposed around the component such that the at least one component is inside the insulating-material layer,
wherein the at least one component is attached to the first conductor pattern by the at least one contact bump,
wherein both the first conductor pattern and the contact bumps are manufactured by growing the first conductor pattern and the contact bumps electrolytically to a desired shape, and
wherein the at least one component comprises a surface having at least one contact bump, whereby the contact bump of the first conductor pattern contacts the contact bump of the at least one component.

22. Method according to claim 1 wherein the component comprises a surface having at least one contact bump, further including the step of bringing the contact bump of the first conductor pattern into contact with the contact bump of the component.

* * * * *